United States Patent [19]
Kamiguchi et al.

[11] Patent Number: 6,088,195
[45] Date of Patent: Jul. 11, 2000

[54] MAGNETORESISTANCE EFFECT ELEMENT

[75] Inventors: Yuzo Kamiguchi; Kazuhiro Saito, both of Yokohama; Hideaki Fukuzawa, Sagamihara; Hiromi Fuke, Kawasaki; Hitoshi Iwasaki, Yokosuka; Masashi Sahashi, Yokohama, all of Japan

[73] Assignee: Kabushiki Kaisha Toshiba, Kawasaki, Japan

[21] Appl. No.: 08/827,122

[22] Filed: Mar. 27, 1997

[30] Foreign Application Priority Data

Mar. 28, 1996 [JP] Japan ................................. 8-073404
Apr. 30, 1996 [JP] Japan ................................. 8-109067

[51] Int. Cl.$^7$ ....................................................... G11B 5/39
[52] U.S. Cl. ........................................................ 360/113
[58] Field of Search ........................... 360/113; 338/32 R; 324/252; 428/611, 635, 928

[56] References Cited

U.S. PATENT DOCUMENTS

| | | | |
|---|---|---|---|
| 5,159,513 | 10/1992 | Dieny et al. | 360/113 |
| 5,493,465 | 2/1996 | Kamiguchi et al. | 360/113 |
| 5,549,978 | 8/1996 | Iwasaki et al. | 360/113 |
| 5,648,885 | 7/1997 | Nishioka et al. | 360/113 |

FOREIGN PATENT DOCUMENTS

| | | |
|---|---|---|
| 1-116914 | 5/1989 | Japan . |
| 4-167214 | 6/1992 | Japan . |

OTHER PUBLICATIONS

B. Dieny et al., "Giant Magnetoresistance of Magnetically Soft Sandwiches: Dependence on Temperature and on layer Thicknesses", Physical Review B, 45(2):806–813 (1992).
B. Dieny et al., "Magnetotransport Properties of Magnetically Soft Spin–valve Structures (invited)", J. Appl. Phys., 69(8):4774–4779 (1991).
S.S.P. Parkin et al., "Oscillations in Exchange Coupling and Magnetoresistance in Metallic Superlattice Structures: Co/Ru, Co/Cr, and Fe/Cr", Physical Review Letters, 64(19):2304–2307 (1990).
R.P. Hunt, "A Magnetoresistive Readout Transducer", IEEE Transactions on Magnetics, Mag–7(1):150–154 (1971).
M.N. Baibich et al., "Giant Magnetoresistance of (001)Fe/(001)Cr Magnetic Superlattices", Physical Review Letters, 61(21):2472–2475 (1988).

*Primary Examiner*—Brian E. Miller
*Attorney, Agent, or Firm*—Finnegan, Henderson, Farabow, Garrett & Dunner, L.L.P.

[57] ABSTRACT

A magnetoresistance effect element is provided with a laminated film which is composed of a first ferromagnetic conductive layer, a non-magnetic conductive layer superposed on the first ferromagnetic film, and a second ferromagnetic conductive layer superposed on the non-magnetic conductor layer, and which is provided with a pair of electrodes formed on the laminated film, wherein at least one of the first and second magnetic conductive layers comprises at least a first ferromagnetic layer and a second ferromagnetic film, for example, Co alloy films whose directions of axis of easy magnetization are different from each other. Furthermore, this element is a magnetoresistance effect element provided with a spin valve film having a non-magnetic layer disposed between a first magnetic layer composed of a laminated film of such a ferromagnetic film as a Co based magnetic alloy and a soft magnetic layer, and a second magnetic layer, wherein the soft magnetic layer is composed of a soft magnetic material laminated film of a soft magnetic material film of one kind or soft magnetic material films of two or more kinds, and values of their magnetization $M_s(T)$, film thickness $d(nm)$, and anisotropic magnetic field $H_k(Oe)$ satisfy $\Sigma(M_s \times d \times H_k) > 30(Tnm\, Oe)$.

7 Claims, 7 Drawing Sheets

MAGNETORESISTANCE EFFECT ELEMENT

BACKGROUND OF THE INVENTION

1. Field of the Invention

The present invention relates to a magnetoresistance effect element.

2. Description of the Related Art

In general, information recorded on a magnetic recording medium has been read out by detecting a voltage induced in a coil by electromagnetic induction. The induction occurs when a reproducing magnetic head having the coil moves in relation to the recording medium. On the other hand, it has been known to use a magnetoresistance effect element (hereinafter referred to as an MR element) in case of reading out information (refer to IEEE MAG-7, 150 (1971) and the like). A magnetic head using an MR element (hereinafter referred to as an MR head) utilizes a phenomenon that electric resistance of a ferromagnetic material of some kind varies according to intensity of an external magnetic field.

In recent years, since making a magnetic recording medium smaller in size and greater in capacity has been promoted and a relative velocity between a reproducing magnetic head and a magnetic recording medium when reading out information has been smaller, the expectation on an MR head which can have a great output for a small relative velocity has been increased.

As described above, a magnetoresistance effect is a phenomenon that electric resistance of a ferromagnetic material is changed by an external magnetic field, and its application has been studied as a high-sensitivity magnetic sensor (for example a head for magnetically recording and reproducing).

Although ferromagnetic material by itself has an anisotropic magnetoresistance effect (AMR), it only shows a resistance change ratio of at most only a few percentages. On the other hand, a giant magnetoresistance effect (GMR) depends on the directions of magnetization of ferromagnetic conductive layers superposed with a non-magnetic conductor layer interposed between the ferrogagnetic layers. This type of structure can give a resistance change ratio exceeding 10%, making it a promising high-sensitivity magnetic sensor, particularly as a read head for magnetic recording.

Magnetoresistance effect elements of the GMR type may comprise an element having a magnetic exchange coupling between ferromagnetic layers (for example a metallic magnetic artificial lattice element) of an element having substantially no exchange interaction (for example a spin valve element).

In order to detect a weak magnetic field in a read head or the like, it is necessary to obtain a great resistance change with a weak magnetic field. Therefore, both a great resistance change ratio and a little saturation magnetic field (a magnetic field where resistance change caused by an applied magnetic field is saturated) are required. Accordingly, in a magnetoresistance effect element of a GMR type, it is required for a ferromagnetic layer forming a laminated film to have a soft magnetic property.

In order to attain such a soft magnetic property, it will do to use a soft magnetic material. However, some materials may be low in resistance change ratio, cannot bear various conditions in manufacturing the element, or may have a problem in durability at the time of operation of the element.

For example, an NiFe alloy (Permalloy or the like), which has a little coercive force, is a typical soft magnetic material, but it is low in Curie temperature and poor in thermal resistance in comparison with a Co alloy. On the other hand, a Co alloy has a great coercive force and has a problem in a soft magnetic property, and its saturation magnetic field is great. Thus, it has been difficult to satisfy the desired properties by selecting materials for the ferromagnetic conductor layers.

An NiFe alloy (a Permalloy alloy) has been used in a part varying in resistance by sensing an external magnetic field outside an MR head (which part is hereinafter referred to as an MR element). However, even a Permalloy alloy having a good soft magnetic property is at most 3% in magnetoresistance change ratio, and is insufficient in magnetoresistance change ratio as an MR element to be used for a magnetic recording medium which has been made small in size and great in capacity. Therefore, an MR element material showing a more high-sensitivity magnetoresistance effect has been desired.

In order to meet such a demand, it has been confirmed that a high magnetoresistance effect occurs in a multi-layered film where ferromagnetic metallic films and non-magnetic metallic films are alternately laminated under a certain condition and where the ferromagnetic metallic films near each other are coupled by antiferromagnetic coupling. Such a structure is called an artificial lattice film. It has been reported that an artificial lattice film shows a great magnetoresistance change ratio of more than 100% at the maximum (see "Phys. Rev. Lett., Vol. 61,2474 (1988), "Phys. Rev. Lett., Vol. 64,2304 (1990) and the like). However, since an artificial lattice film has a high saturation magnetic field, it is generally unsuitable for an MR element.

On the other hand, an example has been reported that a multilayered film of a sandwich structure of a ferromagnetic film/a non-magnetic film/a ferromagnetic film, in which the ferromagnetic films are not coupled by antiferromagnetic coupling, also has a great magnetoresistance effect. Namely, one of the two ferromagnetic films having a non-magnetic film interposed between them is fixedly magnetized by applying an exchange bias to it. The other ferromagnetic film is reversed in magnetization by an external magnetic field (a signal magnetic field or the like). In this way, a great magnetoresistance effect can be obtained by changing a relative angle made between the directions of magnetization of the two ferromagnetic films disposed so as to have a non-magnetic film interposed between them. A multilayered film of such a type is called a spin valve film (see "Phys. Rev. B., Vol.45,806 (1992), "J. Appl. Phys., Vol. 69,4774 (1991), and the like). Although a spin valve film has a smaller magnetoresistance change ratio in comparison with an artificial lattice film, it is suitable for an MR element because it can saturate magnetization in a low magnetic field. A great expectation in practical use is placed on an MR head using such a spin valve film.

In an MR element using a spin valve film where the ferromagnetic films are not coupled by antiferromagnetic coupling, element sensitivity, can be improved by improving a soft magnetic property of the ferromagnetic film to be reversed in magnetization by an external magnetic field. However, since a material bringing a great MR change quantity does not always show a good soft magnetic property, it has been an important problem to reconcile these two properties with each other.

For example, although a spin valve film using a Co film or a Co based magnetic alloy film as a ferromagnetic film, or a crystalline Co film or a crystalline Co based magnetic alloy film, shows a good MR change quantity, it is difficult to achieve a soft magnetic property. In general, in Co or a Co based magnetic alloy, dispersion of magnetic anisotropy is generated. In addition, a great coercive force $H_c$ is generated in magnetic hysteresis in a direction of hard axis of magnetization. Therefore, a sensor device using an MR element having a spin valve film using Co or a Co based magnetic alloy, the deterioration of the S/N ratio caused by Barkhausen noises will make use of the sensor device impratical.

Particularly, in a spin valve film, it is desirable to make the directions of magnetization of the two ferromagnetic films having a non-magnetic film interposed between them nearly perpendicular to each other in the zero magnetic field. This is done through an annealing process. However, when performing such an annealing process, a problem happens that dispersion of magnetic anisotropy becomes greater and the S/N ratio is deteriorated by Barkhausen noises.

Thus, in an MR element using a spin valve film, it has been a problem to realize a good soft magnetic property in good repeatability in a spin valve film having a great MR change quantity and a low coercive force $H_c$ in a direction of hard axis of magnetization by suppressing dispersion of magnetic anisotropy. It is also desired to suppress Barkhausen noises in case of using an MR element using a spin valve film as a sensor device by reducing a coercive force $H_c$ in direction of hard axis of magnetization.

SUMMARY OF THE INVENTION

A first object of the invention is to provide a magnetoresistance effect element which can reduce its saturation magnetic field when using a material having a great coercive force as a ferromagnetic conductive layer. A second object of the invention is to provide a magnetoresistance effect element using a spin valve film making it possible to attain a great MR change quantity and a good soft magnetic property in good repeatability.

A first magnetoresistance effect element of the invention comprises a laminated film comprising a first ferromagnetic conductive film, a non-magnetic conductive layer superposed on the first ferromagnetic conductive layer, and a second ferromagnetic conductive film superposed on the non-magnetic conductive layer and a pair of electrodes formed on this laminated film wherein one of the first ferromagnetic conductive layer and the second ferromagnetic conductive layer is provided with at least a first ferromagnetic film and a second ferromagnetic film having a direction of axis of easy magnetization different from that of the first ferromagnetic layer.

In the first magnetoresistance effect element, the ferromagnetic conductive layer composed of plural ferromagnetic films whose directions of axis of easy magnetization are different from one another has an exchange coupling generated directly between the ferromagnetic films, and therefore the ferromagnetic conductive layer acts in magnetization as one body on the whole.

Since there are ferromagnetic films having directions of axis of easy magnetization different from each other in this element, their anisotropic energies cancel each other and a low saturation magnetic field can be attained as a whole. The effect of cancellation appears most effectively in case that the easy axes of magnetization are nearly perpendicular to each other. Namely, the first magnetoresistance effect element is characterized by that the directions of axis of easy magnetization of the first ferromagnetic film and the second ferromagnetic film are nearly perpendicular to each other.

Furthermore, the first magnetoresistance effect element is characterized by that the first ferromagnetic film is made of Co or a Co alloy and said first ferromagnetic film is arranged so as to be in contact with a non-magnetic conductor layer.

A second magnetoresistance effect element of the invention is a magnetoresistance effect element of a spin valve type, which comprises a laminated film in which a free layer which is composed of a ferromagnetic conductive layer having an uniaxial magnetic anisotropy given in a direction in its film plane and whose magnetization direction is rotated by a magnetic field to be measured and a pin layer which is composed of a ferromagnetic conductive layer having an uniaxial magnetic anisotropy given in a direction in its film plane and whose magnetization direction is not rotated by a magnetic field to be measured are superposed with a non-magnetic conductor layer between them, and which detects a magnetic field to be measured from variation in electric resistance of said laminated film depending on an angle made between the magnetization directions of the free layer and the pin layer, wherein the free layer comprises at least a first ferromagnetic layer and a second ferromagnetic film having a direction of axis of easy magnetization different from that of the first ferromagnetic layer and keeps an uniaxial magnetic anisotropy in a specified direction as the whole free layer.

The second magnetoresistance effect element is characterized by that the direction of axis of easy magnetization of first ferromagnetic film and the second ferromagnetic film is nearly perpendicular to that of the second ferromagnetic film.

Further a third magnetoresistance effect element comprises a laminated film comprising a first ferromagnetic conductive layer having an uniaxial magnetic anisotropy given in a direction in its film plane, a non-magnetic conductor layer superposed on the first main surface of the first ferromagnetic conductive layer, a second ferromagnetic conductive layer which is superposed on the non-magnetic conductor layer and has an uniaxial magnetic anisotropy given in a direction in its film plane, and a magnetically fixing film which is superposed on the second main surface of said first ferromagnetic conductive layer and is composed of an antiferromagnetic material; and a pair of electrodes formed on the laminated film wherein the second ferromagnetic conductive layer comprises at least a first and a second ferromagnetic film whose directions of an axis of easy magnetization are different from each other and keeps an uniaxial magnetic anisotropy in a specified direction as said whole second ferromagnetic conductive layer.

The third magnetoresistance effect element is, furthermore, characterized by that the direction of axis of easy magnetization of the first ferromagnetic layer is nearly perpendicular to that of the second ferromagnetic layer and the direction of axis of easy magnetization of one of said first ferromagnetic film and said second ferromagnetic film and the direction of axis of easy magnetization of the first ferromagnetic conductive layer are nearly in parallel with each other.

In the third magnetoresistance effect element, furthermore, it is preferable that the second ferromagnetic conductive layer is applied a bias magnetic field which is so intense that its magnetization direction can be rotated by an external magnetic field and which is in a direction perpendicular to the magnetization direction of the first ferromagnetic conductive layer.

A method for manufacturing one of the first to third magnetoresistance effect elements, namely, a method for manufacturing a magnetoresistance effect element comprising a laminated film member which comprises a first ferromagnetic conductive layer, a non-magnetic conductive layer superposed on the first ferromagnetic conductive layer, and a second ferromagnetic conductive layer superposed on the non-magnetic conductive layer and which shows a magnetoresistance effect, wherein at least one of the first and second ferromagnetic conductive layers comprises at least a first and a second ferromagnetic films whose directions of axis of easy magnetization are different from each other, the method for manufacturing a magnetoresistance effect comprises a heat treatment process comprising the steps of heating the laminated film to a first temperature and keeping it as applying a magnetic field to it in a first direction for a specified time, cooling it to a second temperature as keeping the magnetic field applied to it, turning the magnetic field to a second direction at a point of time when it has been cooled to the second temperature and cooling it to the room temperature as it is, and thus performing a heat treatment so as to give different directions of axis of easy magnetization to the first and second ferromagnetic films.

And in the above-mentioned manufacturing method, an orthogonalizing heat treatment is preferable which turns the second magnetic field direction by about 90 degrees from the first magnetic field direction. Furthermore, in the manufacturing method, it is preferable to perform a heat treatment so that the total of the anisotropic magnetic fields of the first and second ferromagnetic films may be 10 Oe or less in intensity.

As described above, in said first to third magnetoresistance effect elements, a ferromagnetic conductive layer composed of plural ferromagnetic films whose directions of axis of easy magnetization are different from each other has an exchange coupling generated directly between the ferromagnetic films, and the ferromagnetic conductive layer acts in magnetization as one body on the whole. Since there are ferromagnetic films whose directions of axis of easy magnetization are different from each other in this element, their anisotropic energies cancel each other and a low saturation magnetic field can be attained as a whole. The effect of cancellation appears most effectively in case that the easy axes of magnetization are nearly perpendicular to each other.

BRIEF DESCRIPTION OF THE DRAWINGS

The accompanying drawings provide a further understanding of the invention and, together with the Detailed Description, explain the principles of the invention. In the drawings.

DETAILED DESCRIPTION

This is described more concretely with reference to the drawings.

Figure 1A:
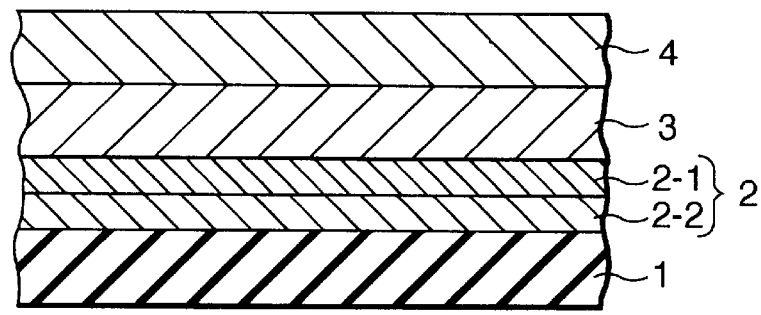
FIG. 1A is a schematic sectional view showing a magnetoresistance effect element of the invention.

As shown in FIG. 1A, a free layer 2, a non-magnetic conductor layer 3, and a pin layer 4 are formed on a substrate 1. Magnetization of pin layer 4 is fixed by an antiferromagnetic film (not illustrated), such as an FeMn film for example. A pair of electrodes are then provided on the laminated film structure of FIG. 1A (not illustrated).

Free layer 2 is composed of a first ferromagnetic film 2-1 and a second ferromagnetic film 2-2. For example, a film which is in contact with the non-magnetic conductor layer 3 is set as the first ferromagnetic film 2-1.

In a magnetoresistance effect element of a spin valve type, since pin layer 4 is fixedly magnetized, it is not required to have a soft magnetic property. Only free layer 2 needs to have a soft magnetic property. Therefore, it will do to realize a multilayered structure and a state of conflicting magnetization so that only the free layer 2 may be improved in soft magnetic property. However, pin layer 4 may also be multilayered if desired.

In case of a GMR type, the interface between a non-magnetic layer and a magnetic layer has a great influence upon the magnetoresistance effect. Therefore, when using Co or a Co alloy which has a great resistance change ratio and an excellent thermal resistance, it will do to make a layered structure in the free layer 2 so that a Co film or a Co alloy film may be disposed at the side in contact with the non-magnetic conductor layer 3 (at the first ferromagnetic film 2-1 side).

A magnetoresistance effect element can be implemented, for example, by making pin layer 4 of a Co layer or a Co alloy layer and making free layer 2 by laminating a first ferromagnetic film 2-1 made of Co or a Co alloy to a second ferromagnetic film 2-2 made of Permalloy or the like, The directions of axis of easy magnetization of the first and the second ferromagnetic films, for example, are then made perpendicular to each other. The perpendicular magnetizations can be realized by performing a heat treatment in a magnetic field.

The first and second ferromagnetic films 2-1 and 2-2 are composed of different materials and are superposed in a lamination structure. In a process of cooling superposed films from a high temperature, a direction in which a magnetic field is applied is turned by 90 degrees, for example. The temperature at which the direction of the applied magnetic field is changed depends upon film composition (i.e., varies according to conditions such as a combination state and a laminated state of the first and second ferromagnetic films 2-1 and 2-2).

By setting a proper temperature, for example, the direction of axis of easy magnetization of the first ferromagnetic film 2-1 is turned to the first magnetic field direction and that of the second ferromagnetic film 2-2 is turned to the second magnetic field direction.

Seeing the whole film, an uniaxial magnetic anisotropy is introduced in the direction of axis of easy magnetization of a film governing the anisotropy. Anisotropy of the whole film is governed by the film which is greater in a product of the intensity of its magnetization and its film thickness and the anisotropic magnetic field.

Assuming that the second ferromagnetic film 2-2 governs magnetization of the laminated film made by laminating the first and second ferromagnetic films 2-1 and 2-2, the direction of axis of easy magnetization of the second ferromagnetic film 2-2 becomes the direction of an uniaxial magnetic anisotropy of this laminated film. Accordingly, it results in being directed to the direc-tion of axis of easy magnetization of the second ferromagnetic film 2-2 in the no magnetic field state of the first ferromagnetic film 2-1.

Figure 1B:
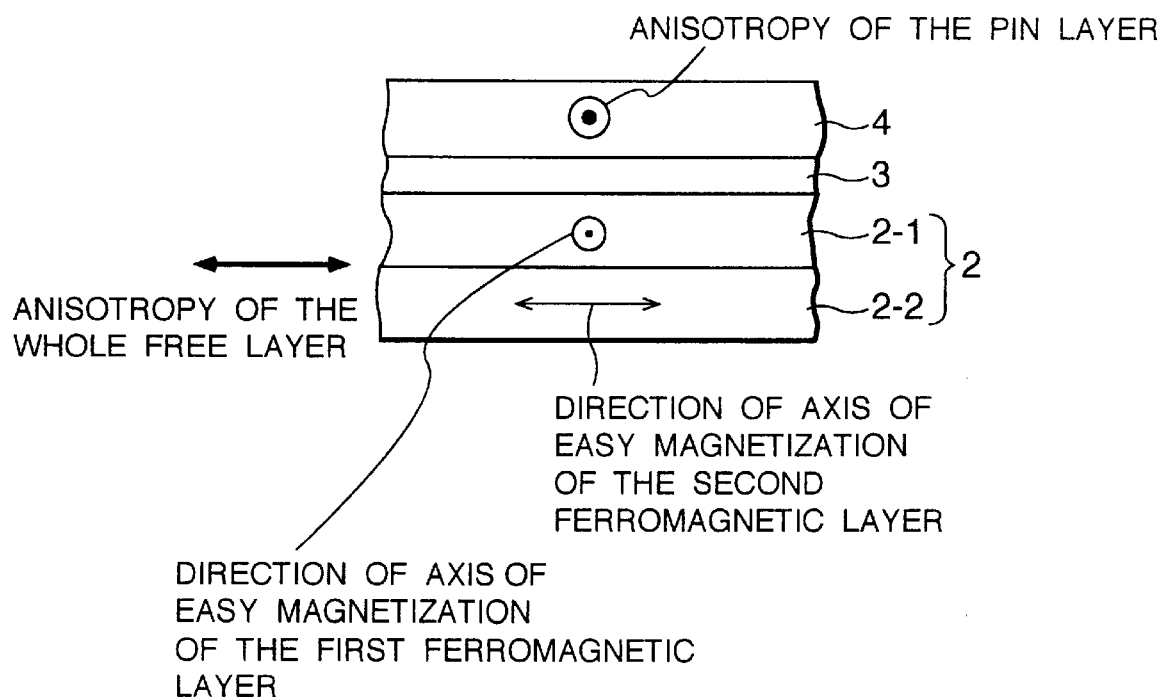
FIG. 1B is a figure for explaining the directions of magnetization of its respective layers.

This situation is shown in FIG. 1B. This shows a state where the direction of axis of easy magnetization of the pin layer 4 coincides with the direction of axis of easy magnetization of the first ferromagnetic film 2-1 and is perpendicular to the direction of axis of easy magnetization of the second ferromagnetic film 2-2. The second ferromagnetic film 2-2 governs the anisotropic direction of the whole free layer 2. As a result, anisotropies perpendicular to each other are respectively introduced in the free layer 2 and the pin layer 4.

Figure 2:
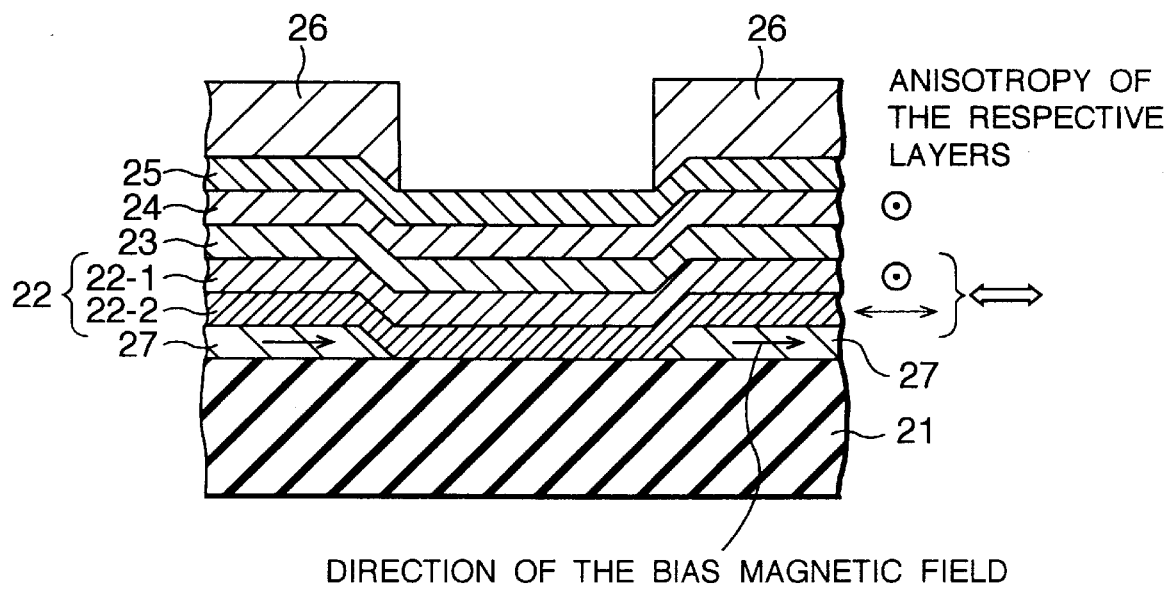
FIG. 2 is a schematic sectional view of a magnetoresistance effect element of a spin valve type according to the invention.

A spin valve type film often uses an antiferromagnetic film for fixing magnetization of pin layer 4. A layer configuration in this case is as shown in FIG. 2 for example. Namely, this is a magnetoresistance effect element comprising a laminated film on a substrate 21.

The laminated film comprises a first ferromagnetic conductive layer (pin layer 24) having an uniaxial magnetic anisotropy given in a direction in its film plane, a non-magnetic conductive layer 23 superposed on the first ferromagnetic conductive layer 24, a second ferromagnetic conductive layer (free layer 22) which is superposed on the non-magnetic conductive layer 23 and has an uniaxial magnetic anisotropy given in a direction in its film plane, and a magnetically fixing film 25 which is superposed on the first ferromagnetic conductive layer 24 and is composed of an antiferromagnetic film. A pair of electrodes 26 are then formed on laminated film. The second ferromagnetic conductive layer further includes a first ferromagnetic film 22-1 and a second ferromagnetic film 22-2 whose directions of axis of easy magnetization are different from each other and having an uniaxial magnetic anisotropy in the same direction as the second ferromagnetic conductive layer 22.

The same anisotropy as shown in FIG. 1B is introduced in this second ferromagnetic conductive layer 22. In this case, a plane in parallel with the paper plane is the recording medium facing surface.

In the structure shown in FIG. 2, a hard magnetic layer 27 such as a CoPt alloy layer for giving a bias magnetic field to a free layer 22 is formed so as to be in contact with the free layer 22. Although the hard magnetic layer 27 is not indispensable, it is preferable to apply a bias magnetic field to the free layer 22 in order to remove Barkhausen noises. The direction of this bias magnetic field is in parallel with the direction of the uniaxial magnetic anisotropy of the free layer 22.

Although the electrodes 26 are preferably provided on a laminated layer in this structure, they may also be provided between the substrate 21 and the laminated film or between the hard magnetic layer 27 and the laminated film. Furthermore, since generally an antiferromagnetic film is poor in corrosion resistance, a protective film may be formed on the antiferromagnetic film 25.

In general, an uniaxial magnetic anisotropy of a free layer is set in parallel with the surface of a recording medium and an uniaxial magnetic anisotropy of a pin layer is set perpendicularly to the surface of the recording medium. Accordingly, in the heat treatment in a magnetic field, it will do to set the first applied magnetic field as the direction of an uniaxial magnetic anisotropy of the pin layer and set the second applied magnetic field as the direction of an uniaxial magnetic anisotropy of the free layer. For example, the direction of axis of easy magnetization of the first magnetic film forming the free layer is the same as the direction of axis of easy magnetization of the pin layer, and the direction of an axis of easy magnetization of the second magnetic film forming the free layer is perpendicular to the direction of axis of easy magnetization of the pin layer.

In this case also, since it is the first ferromagnetic film 22 in contact with the non-magnetic conductor film 23 that greatly contributes to a magnetoresistance effect, the properties, which is difficult to reconcile by the first ferromagnetic film 22-1 alone, can be reconciled by adding the second ferromagnetic film 22-2, as satisfying the conditions according to the invention.

It will do that at least one of the first and second ferromagnetic conductive layers 24 and 22 of the invention contains plural magnetic films and it is a matter of course that it may contain two or more ferromagnetic films.

Here, a case is explained where the free layer 22 is composed of a laminated film made by laminating two kinds of magnetic films, and activation energies of the respective magnetic films are $\epsilon 1$ and $\epsilon 2$ (eV). A uniaxial magnetic anisotropy having a little dispersion in one direction is given to the laminated film by a method of forming the film in a magnetic field or a method of annealing it for a long time at a temperature high enough in comparison with the activation energy.

Generally, in case of annealing a magnetic film having an inductive magnetic anisotropy given at a temperature Ta as applying a magnetic field in the direction perpendicular to its axis of easy magnetization to the magnetic film, the anisotropic magnetic field varies according to the following expression;

$H_k = 2H_{k0} (\exp \{-A \exp (-\beta\epsilon)t\} - 0.5)$, where $H_{k0}$ is an anisotropic magnetic field in case of annealing the magnetic film for the infinite time, A is a constant obtained by an experiment, t is a heat treatment time, $\beta = 1/(kB \cdot Ta)$, kB is a Boltzmann constant, and Ta is an annealing temperature. Here, the value A obtained from an experiment of a CoNbZr film is 11.6.

Figure 3:
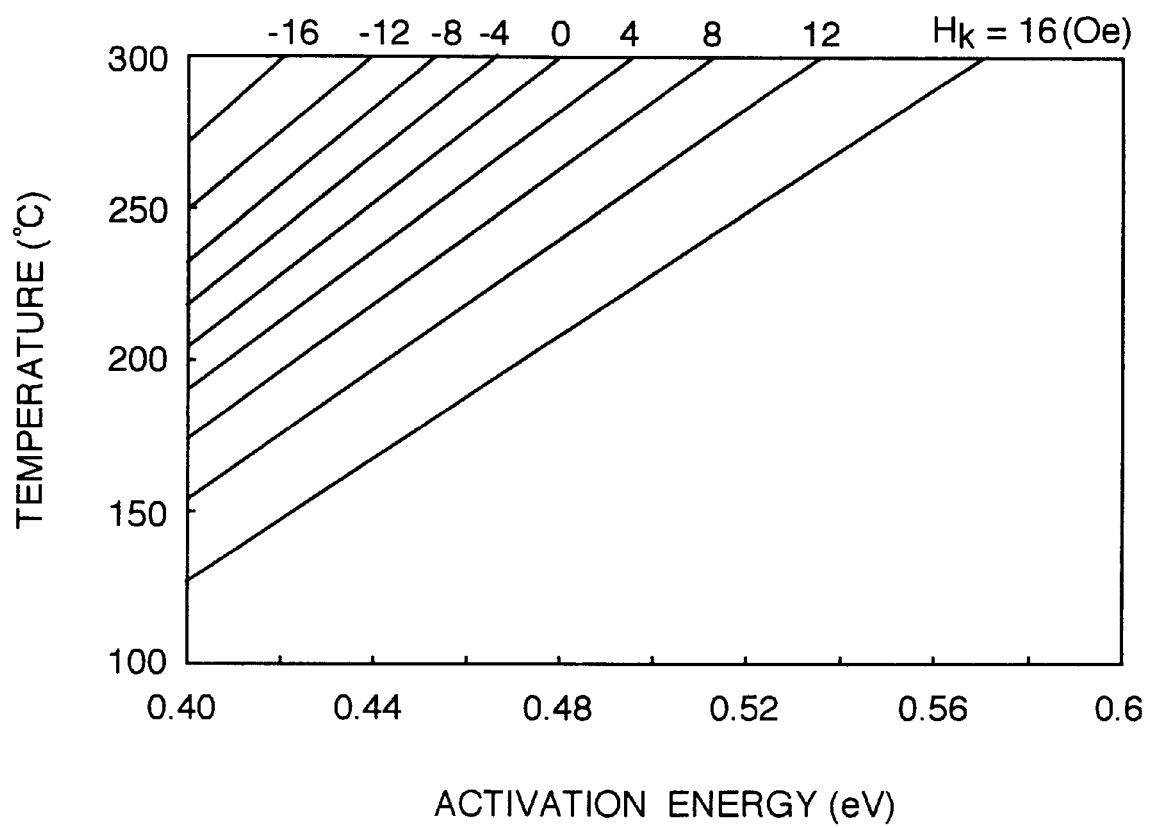
FIG. 3 is a characteristic diagram for explaining the invention (a diagram for explaining relation among activation energy of a magnetic film, its annealing temperature, and its anisotropic magnetic field)

FIG. 3 shows a result of computing H, depending upon an activation energy c and an annealing temperature Ta by means of this expression. The annealing time is 1000 seconds.

As shown by FIG. 3, even in case of performing an orthogonalizing heat treatment at the same temperature, when the activation energy varies, the resultant value of $H_k$ varies. And it is known that it is possible to bring the $H_k$ close to nearly zero by selecting a proper annealing temperature to an activation energy.

In case of annealing a single film, however, since dispersion of anisotropy happens, $H_k$ becomes smaller but a coercive force $H_c$ becomes greater and as a result such a problem that Barkhausen noises appear happens.

On the other hand, for a free layer is composed of a laminated film of two magnetic films and their activation energies $\epsilon$ are different from each other, and when performing an orthogonalizing annealing process on the free layer at a temperature Ta, the values of anisotropic magnetic fields of the respective layers will be different.

Now, it is assumed that in case of making a laminated magnetic film of two layers using magnetic materials in which $\epsilon 1=0.42$ (eV) and $\epsilon 2=0.52$ (eV), the layers are set in thickness so that the ($M_s \cdot d$) products of both the layers (where $M_s$ is a saturated magnetization and d is a film thickness) may be equal to each other (1:1). Then, performing an orthogonalizing heat treatment at 200° C., $H_k$ of the layer 1 becomes 8 (Oe) and $H_k$ of the layer 2 becomes 20 (Oe), and the resultant value of $H_k$ becomes 14 (Oe) on an average. For a heat treatment at 270° C., $H_k$ of the layer 1 becomes −10 (Oe) and $H_k$ of the layer 2 becomes 14 (Oe) , and the resultant value of H, can be made as small as 2 (Oe) on an average. Further, each of the layers has a sufficiently great anisotropy given to it with little dispersion of anisotropy.

Furthermore, performing an orthogonalizing heat treatment at 300° C., $H_k$ of the layer 1 becomes −16 (Oe) and $H_k$ of the layer 2 becomes 0 (Oe), and the resultant value of $H_k$ becomes −8 (Oe) on an average. In this case, such a problem happens that the anisotropy is turned by 90 degrees as a whole or a certain coercive force appears on the whole due to dispersion -of anisotropy caused by the too much lowered $H_k$ of the layer 2. In such a case, therefore, an orthogonalizing heat treatment temperature of about 270° C. is the optimal temperature. In case that a ferromagnetic conductive layer is composed of plural ferromagnetic films having easy axes perpendicular to each other (in the first direction and the second direction), $H_k$ (total)=$(\Sigma_1(M_s \cdot t \cdot H_k) - \Sigma_2(M_s \cdot t \cdot H_k))/\Sigma_{1,2}(M_s \cdot t)$, where $M_s$: Saturation flux density of each layer t: Thickness of each layer Hk: Anisotropic magnetic field of each layer $\Sigma_1$: Sum for a ferromagnetic film having the axis of easy magnetization in the first direction $\Sigma_2$: Sum for a ferromagnetic film having the axis of easy magnetization in the second direction $\Sigma_{1,2}$: Sum for the whole ferromagnetic film.

The smaller the absolute value of the $H_k$ (total) represented by the above expression is, the better the soft magnetic property of the magnetic film. In practical use, it is preferable to make $H_k$ be 10 (Oe) or less. Accordingly, a temperature is selected to satisfy this relation.

Fe, Co, Ni, and their alloys are ferromagnetic conductive materials that can be used in the present invention. Particularly, Co or a Co alloy effective to obtain a high thermal resistance and a high resistance change ratio. For example, a CoFe alloy rich in Co which contains Fe of 5 to 40 atom % may be used. An additive element as Pt may also be added. The film thickness is about 5 nm to 20 nm.

By using a Co alloy as a magnetic film at the side in contact with a non-magnetic conductive layer and attaining a soft magnetic property as a whole through laminating it together with another magnetic film, it is possible to make the best use of its feature such as a high thermal resistance (reducing diffusion to the non-magnetic layer) and a high resistance change ratio at the maximum.

And Cu, Au, Ag, and the like may be used as a non-magnetic conductor. In the same way, the film thickness is about 5 nm to 20 nm. Furthermore, FeMn, NiO, IrMn, and the like can be used as an antiferromagnetic material.

A fourth magnetoresistance effect element of the invention is a magnetoresistance effect element provided with a spin valve film. The magnetoresistance effect element includes a first magnetic layer, composed of a laminated film made by laminating a ferromagnetic film containing Co and a soft magnetic film on each other, and a second magnetic layer. A non-magnetic layer is disposed between the first magnetic layer and the second magnetic layer. The soft magnetic film is composed of a soft magnetic material film. The soft magnetic material film may comprise a plurality of films laminated together, the films being the same or different type. Assuming that magnetization of the soft magnetic material film or the soft magnetic material laminated film is $M_s(T)$, its thickness is d(nm), and its anisotropic magnetic field is $H_k$ (Oe), the formula of $\Sigma(M_s \times d \times H_k) > 30$(Tnm Oe) is satisfied, where the $\Sigma(M_s \times d \times H_k)$ value shows the sum of $(M_s \times d \times H_k)$ values of the respective soft magnetic material films.

In a magnetoresistance effect element of the invention, a soft magnetic material film or a soft magnetic material laminated film whose $\Sigma(M_s \times d \times H_k)$ value is greater than 30(Tnm Oe) is used as a soft magnetic layer formed in contact with a ferromagnetic film containing Co. Here, the $\Sigma(M_s \times d \times H_k)$ value of said soft magnetic layer represents a force suppressing dispersion of anisotropy of the ferromagnetic film containing Co. By using such a soft magnetic film whose $\Sigma(M_s \times d \times H_k)$ value is greater than 30(Tnm Oe), it is possible to suppress dispersion of anisotropy of the ferromagnetic film containing Co in good repeatability. By this, it is possible to reduce a coercive force $H_k$ in the direction of hard axis of magnetization of a ferromagnetic film containing Co, for example, to 1 Oe or less. Namely, it is possible to improve a ferromagnetic film containing Co in soft magnetic property.

A method for manufacturing the fourth magnetoresistance effect element of the invention, namely, a method for manufacturing a magnetoresistance effect element provided with a spin valve film comprising a first magnetic layer composed of a laminated film made by laminating a ferromagnetic film containing Co and a soft magnetic film on each other, a second magnetic layer, and a non-magnetic layer disposed between the first magnetic layer and the second magnetic layer. The method for manufacturing a magnetoresistance effect element makes a spin valve magnetoresistance effect element by forming a soft magnetic film on a substrate, forming a first magnetic layer by laminating a ferromagnetic film containing Co on said soft magnetic film, superposing a non-magnetic layer on said first magnetic layer, forming a second magnetic layer composed of a ferromagnetic material containing Co on the non-magnetic layer, forming an antiferromagnetic film on the second magnetic layer, and thus forming a spin valve film, and then applying an orthogonalizing annealing process on the spin valve film.

The fourth magnetoresistance effect element of the invention is described furthermore in the following.

Figure 4:
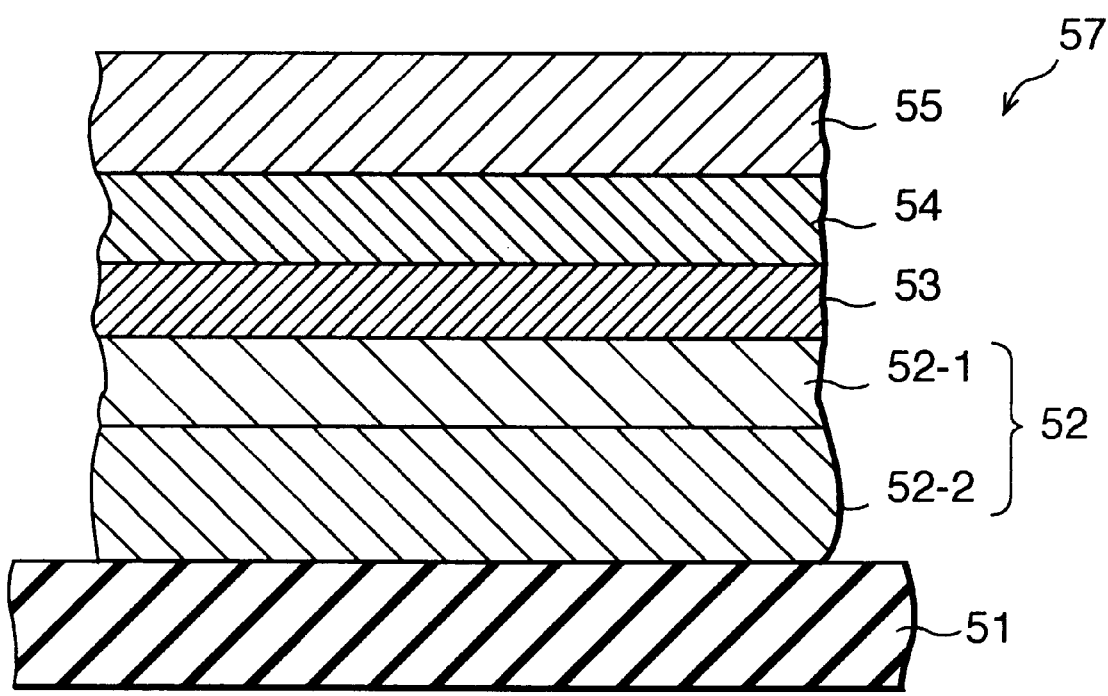
FIG. 4 is a sectional view of the main part structure of an embodiment of another magnetoresistance effect element of the invention.

FIG. 4 is a sectional view for showing the main composition of a magnetoresistance effect element (MR element) according to an embodiment of the invention. In FIG. 4, reference number 51 is a substrate, 52 is a first magnetic layer, 54 is a second magnetic layer, and a non-magnetic layer 53 is interposed between these first and second magnetic layers 52 and 54. Between these magnetic layers 52 and 54, there is no antiferromagnetic coupling and a laminated film of non-coupling type is formed.

The first magnetic layer 52 is composed of a laminated film composed of a ferromagnetic film 52-1 ' of a ferromagnetic material containing Co and a soft magnetic film 52-2 of a soft magnetic material. The ferromagnetic film 52-1 is a layer contributing to a magnetoresistance effect and the soft magnetic film 52-2 is a layer for improving the ferromagnetic film 52-1 in its soft magnetic property, as described later. The soft magnetic film 52-2 may be composed of a soft magnetic material film of a soft magnetic material of a kind, or may be composed of a soft magnetic material laminated film of soft magnetic material films of two or more kinds.

The first magnetic layer 52 composed of the ferromagnetic film 52-1 and the soft magnetic film 52-2 is arranged so that the ferromagnetic film 52-1 may be in contact with the non-magnetic layer 53. Although they are not always limited to this arrangement, it is desirable to perform the above-mentioned arrangement in order to obtain a great MR change quantity. It is also desirable to make a magnetic exchange coupling directly between the ferromagnetic film 52-1 and the soft magnetic film 52-2 and to make them act in magnetization as one body when being seen from the film thickness direction.

This first magnetic film 52 is a magnetic layer, what is called a free layer, whose magnetization is rotated by an external magnetic field such as a signal magnetic field. The ferromagnetic film 52-1 is preferably a crystalline layer which is good in MR change quantity but is difficult to magnetize.

As the ferromagnetic film 52-1 in the first magnetic layer 52, Co alone or a Co based magnetic alloy can be used. However, it is preferable to use a Co based magnetic alloy capable of increasing both an interfacial effect and bulk effect, causing the MR change quantity to increase. A Co based magnetic alloy, may be obtained by adding one or more of Fe, Ni, Au, Ag, Cu, Pd, Pt, Ir, Rh, Ru, Os, Hf, and the like to Co. An amount of elements to be added is preferably 5 to 50 atom %, and more preferably in a range of 8 to 20 atom %. The reason is that when the amount of added elements is too little, the bulk effect is not sufficiently increased. Conversely, when the amount of added elements is too much, there is a possibility that the interfacial effect is remarkably decreased. As an additive element, it is preferable to use Fe in order to obtain a great MR change quantity. It is also preferable that the ferromagnetic film 52-1 and the soft magnetic film 52-2 are not less than 1 nm in thickness, from a viewpoint of thermal stability. It is preferable for the ferromagnetic film 52-1 to be not greater than 10 nm in thickness, since when it is too thick, there is a possibility that (1) the MR change ratio is decreased, (2) Barkhausen noises are liable to appear due to an antimagnetic field, and (3) an effect of suppressing dispersion of anisotropy obtained from the soft magnetic film 52-2 is reduced. More preferably ferromagnetic film 52-1 is not greater than 5 nm in thickness. Thickness of the soft magnetic film 52-2 is described in detail below.

On the other hand, the second magnetic layer 54 is a ferromagnetic film composed of Co alone or a Co based magnetic alloy in the same way as the ferromagnetic film in the first magnetic layer 52. In addition, it is preferable to use a Co based magnetic alloy from the same reason as the first magnetic layer 52. This second magnetic layer 54 is given a bias magnetic field and fixedly magnetized by an antiferromagnetic film 55 composed of an IrMn film, an FeMn film, an NiO film or the like, or a hard magnetic layer composed of a CoPt film or the like which are formed on it. This second magnetic layer 54 is what is called a pin magnetic layer.

Thickness of the second magnetic layer 54 is preferably in a range of 1 to 10 nm, where a great MR change quantity can be obtained. The second magnetic layer 54 as a pin layer is not limited to a ferromagnetic film fixedly magnetized by an antiferromagnetic film 56 and the like, as described above, but a hard magnetic layer can be directly used as the second magnetic layer 54.

Here, it is preferable for the directions of magnetization of the first magnetic layer 52 and the second magnetic layer 54 to be perpendicular to each other in a state of no external magnetic field. This improves the MR element in its linear response. Such a state of magnetization can be obtained by performing an annealing process. Namely, the annealing process comprises the steps of (1) keeping a sample at a temperature of about 250° C. while applying a magnetic field of about 1 kOe to it for one hour, (2) cooling the sample to a temperature of about 210° C. while applying a magnetic field of about 1 kOe, and (3) turning the direction of the applied magnetic field by 90° C. when the sample has been cooled to a temperature of about 210° C. and then cooling the sample to the room temperature. A state of orthogonalized magnetization can be stably obtained by such an annealing process (hereinafter referred to as an orthogonalizing annealing process).

As for a concrete direction of magnetization, it is preferable that the first magnetic layer 52 is magnetized in the track width direction and the second magnetic layer 54 is magnetized in a direction perpendicular to the recording medium facing the surface perpendicular to the direction of magnetization of the first magnetic layer 52.

Non-magnetic layer 53, disposed between the first and second magnetic layers 52 and 54, may be formed of Cu, Au, Ag and the like. These non-magnetic films may also be made of a material obtained by mixing a non-magnetic material with a magnetic material. Here, it is preferable for the non-magnetic layer 53 to be set at 2 to 5 nm in thickness. when the non-magnetic layer 53 is greater than 5 nm in thickness, a sufficient resistance change sensitivity cannot be obtained, and when it is less than 2 nm in thickness, it is difficult to make small enough an exchange coupling between the magnetic layers 52 and 54.

A spin valve laminated film 57 is composed of the layers. In an MR element provided with such a spin valve laminated film 57, the first magnetic layer 52 is rotated in magnetization by an external magnetic field while the second magnetic layer 54 is fixedly magnetized. Therefore, a magnetoresistance effect can be obtained by variation of a relative angle between the directions of magnetization of the two magnetic layers 52 and 54 disposed so as to have a middle non-magnetic layer 53 interposed between them. In this case, since a ferromagnetic material containing Co, or a Co based magnetic alloy, is used as a ferromagnetic-film, forming the first magnetic layer 52 and the second magnetic layer 54, a great MR change quantity can be obtained.

Here, although Co or a Co based magnetic alloy brings a great MR change quantity, it is difficult to attain a good soft magnetic property by itself. Further, its coercive force $H_c$ in the direction of hard axis of magnetization typically becomes great due to dispersion of magnetic anisotropy. The dispersion of anisotropy may be caused sometimes by dispersion of a crystal magnetic anisotropy and sometimes by an inductive magnetic anisotropy. Particularly, when performing an orthogonalizing annealing process peculiar to a spin valve film as described above, dispersion of anisotropy is liable to be made great. In a Co based magnetic alloy, the more Co there is, the greater the degree of dispersion of anisotropy.

In the invention, the first magnetic layer 52, which is rotated in magnetization by an external magnetic field, is composed of a laminated film of the ferromagnetic film 52-1 and the soft magnetic film 52-2. A material for the soft magnetic film 52-2 and thickness of it are set so that a value of $\Sigma(M_s \times d \times H_k)$ may not be less than 30(Tnm Oe), where magnetization of the soft magnetic film 52-2 is $M_s(T)$, its film thickness is d (nm), and its anisotropic magnetic field is $H_k$(Oe). In case that the soft magnetic film 52-2 is composed of a soft magnetic material of one kind, a value of $\Sigma(M_s \times d \times H_k)$ is the value of its $\Sigma(M_s \times d \times H_k)$. In case that the soft magnetic film 52-2 is composed of a laminated film of soft magnetic material films of two or more kinds, it is the sum of $\Sigma(M_s \times d \times H_k)$ values of the respective soft magnetic material films.

By examining the relation between a coercive force $H_c$ in hysteresis in the direction of hard axis of magnetization and a magnetic property of the soft magnetic film 52-2, in a laminated film including a ferromagnetic film 52-1 containing Co, it is shown that there is a definite relation between the sum ($\Sigma(M_s \times d \times H_k)$ value) of products ($M_s \times d \times H_k$) values each of which is obtained by multiplying magnetization $M_s$ (T) of a soft magnetic layer, its film thickness d(nm), and its anisotropic magnetic field $H_k$ (Oe) by one another and said coercive force $H_c$. In case that the $\Sigma(M_s \times d \times H_k)$ value is more than 30(Tnm Oe), the coercive force $H_c$ in the direction of hard axis of magnetization can be reduced in good repeatability.

Figure 5:
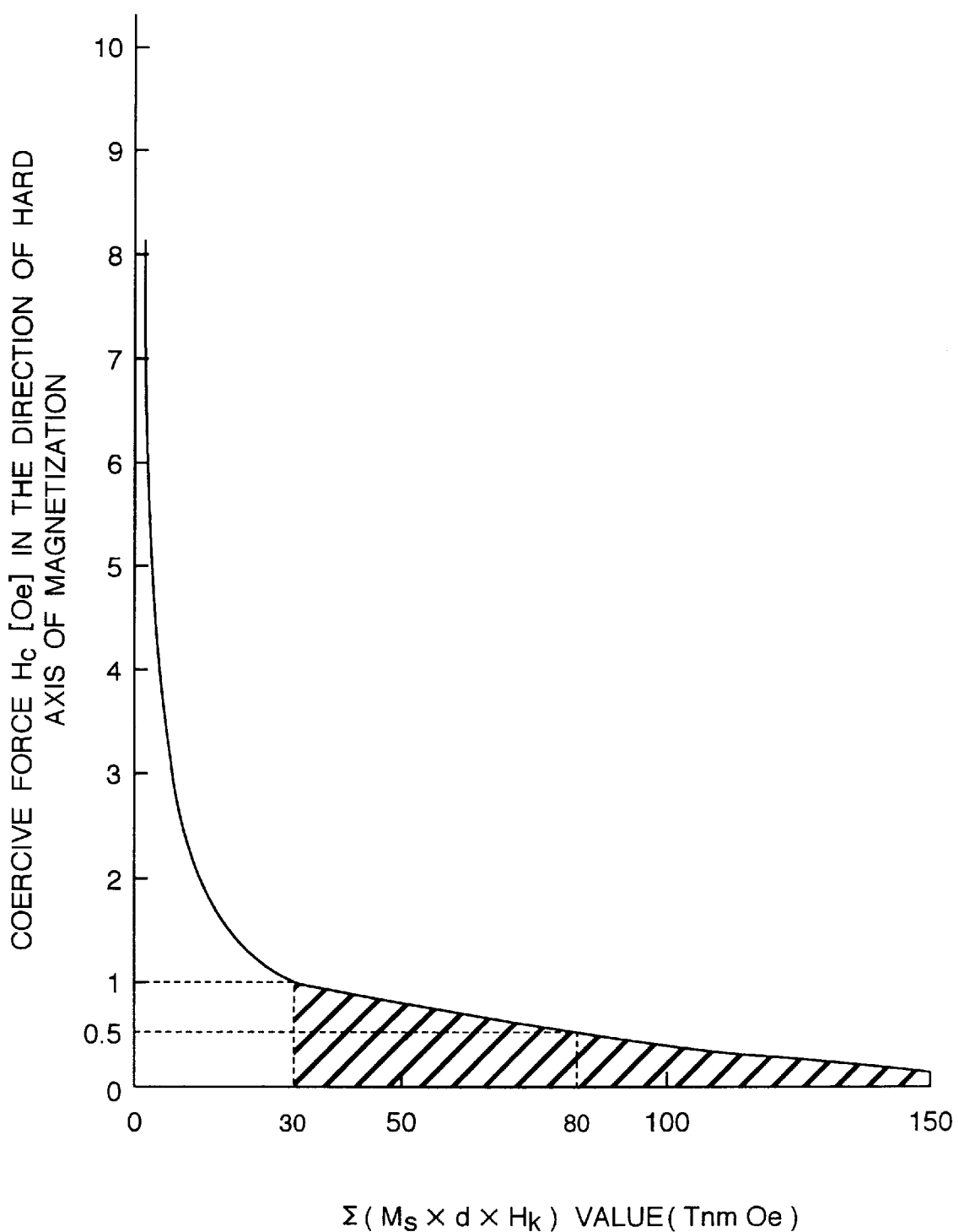
FIG. 5 is a diagram showing relation between a coercive force $H_c$ in the direction of hard axis of magnetization of the first magnetic layer and a $\Sigma(M_s \times d \times H_k)$ value of the soft magnetic layer.

FIG. 5 shows a result of examining variation of a coercive force $H_c$ in the direction of hard axis of magnetization in case of varying the $\Sigma(M_s \times d \times H_k)$ value by changing the soft magnetic film 52-2 in composition. As shown in FIG. 5, a coercive force $H_c$ in the direction of hard axis of magnetization is inversely proportional upon the $\Sigma(M_s \times d \times H_k)$ value, such that if decreases-with an increase in the $\Sigma(M_s \times d \times H_k)$ value. The reason is that dispersion of anisotropy of the ferromagnetic film 52-1 containing Co is suppressed by an uniaxial magnetic anisotropy of the soft magnetic film 52-2. Namely, the $\Sigma(M_s \times d \times H_k)$ value represents a force to suppress dispersion of anisotropy of the ferromagnetic film 52-1 containing Co. By using a soft magnetic film 52-2 in which this value is greater than 30(Tnm Oe), it is possible to reduce a coercive force $H_c$ in the direction of hard axis of magnetization to 1 Oe or less, for example.

In such a way, by making a coercive force $H_c$ for example, not greater than 1 Oe in the direction of hard axis of magnetization of the first magnetic layer 52 which is a free magnetic layer, it is possible to stably suppress occurrence of Barkhausen noises using an MR element provided with a spin valve laminated film 57 as a sensor device of a magnetic head or the like. Therefore, a sensor device having a good S/N ratio can be obtained. It is preferable that said $\Sigma(M_s \times d \times H_k)$ value satisfies a condition of $\Sigma(M_s \times d \times H_k) > 50$(Tnm Oe) in order to stably attain a low coercive force $H_c$. It is also preferable to satisfy a condition of $\Sigma(M_s \times d \times H_k) > 80$(Tnm Oe) in order to attain a lower coercive force $H_c$ for example, $H_c < 0.5$ Oe.

The soft magnetic film 52-2 is not limited to a particular composition as long as it satisfies $\Sigma(M_s \times d \times H_k) > 30$(Tnm Oe). However, it is preferable to have at least one layer of a soft magnetic material film which has a good uniaxial magnetic anisotropy in order to suppress dispersion of anisotropy of the ferromagnetic film 52-1 and an anisotropic magnetic field $H_k$ of not less than 5 Oe in order to stabilize the soft magnetic film 52-2 itself. Soft magnetic film 52-2 may be formed using an NiFe alloy, an NiFeCo alloy, an alloy which is given a high resistance by adding such an additive element as Ti, V, Cr, Mn, Zn, Nb, Mo, Tc,.Hf, Ta, W, Re, or the like to such a soft magnetic alloy of fcc crystal structure, an alloy made amorphous by adding the same additive element as mentioned above to Co, for example, an amorphous CoNbZr alloy, or the like.

Among the above-mentioned soft magnetic materials, an NiFe alloy, an NiFeCo alloy, or the like, has a fcc crystal structure and contributes to improving the ferromagnetic layer containing Co in crystallinity and soft magnetic property, but since its anisotropic magnetic field $H_k$ is less than 5 Oe, it is preferable to use it as a laminated film laminated together with an amorphous CoNbZr alloy or the like. As another preferable embodiment, a film of an NiFeCo alloy composed so that its anisotropic magnetic field Hk may not be less than 5 Oe is used by itself.

In an MR element of this embodiment, since a ferromagnetic material containing Co is used as the ferromagnetic film 52-1 of the first magnetic layer 52, a great MR change quantity is obtained. Further, since the ferromagnetic film 52-1 containing Co is used in a laminated film laminated together with the soft magnetic film 52-2 of $\Sigma(M_s \times d \times H_k) > 30$(Tmn Oe), dispersion of anisotropy of the first magnetic film 52-1 containing Co is suppressed and a good soft magnetic property is obtained. In this way, in a spin valve laminated film 57 of an MR element of the present embodiment, a great MR change quantity and a good soft magnetic property are reconciled with each other, and therefore it is possible to obtain an excellent device sensitivity and a good S/N ratio by suppressing occurrence of Barkhausen noises in case of using it in a sensor device. Namely, it is possible to greatly improve an MR element using a spin valve film.

Figure 6:
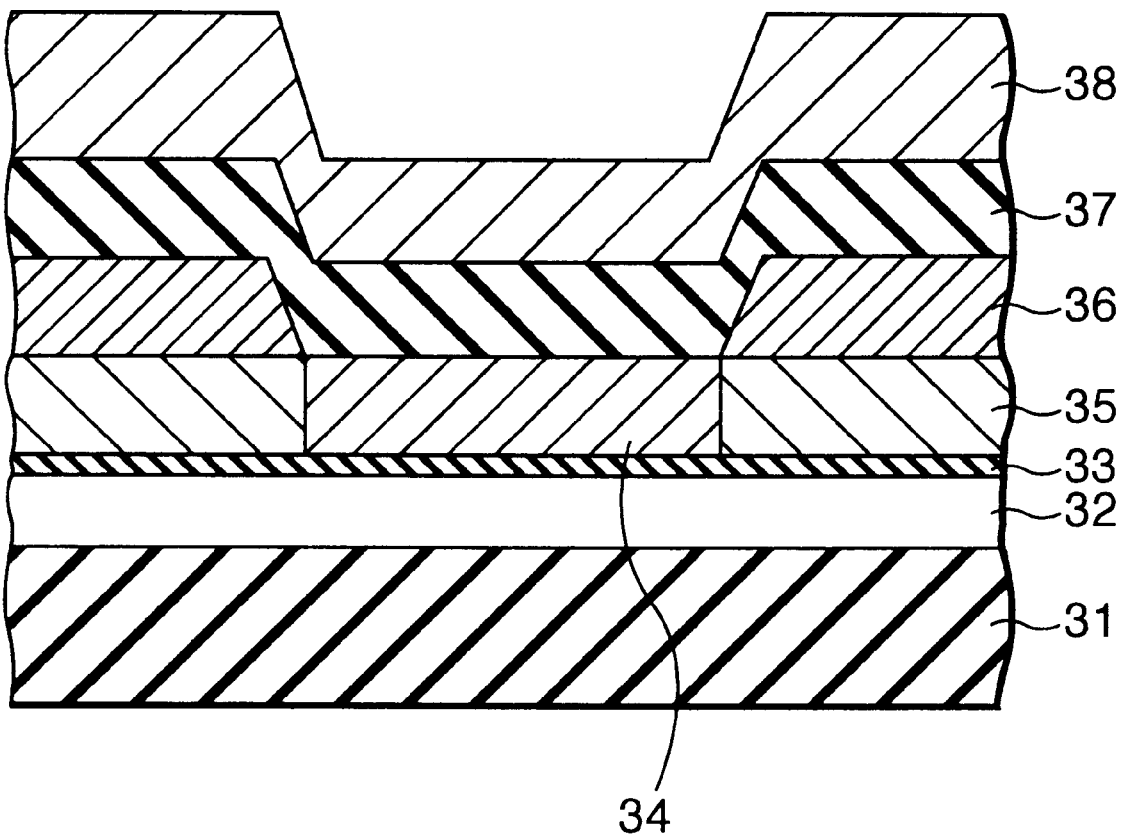
FIG. 6 is a schematic sectional view of an example of a magnetic reproducing head using a magnetoresistance effect element of the invention.

In case of using the first to fourth magnetoresistance effect elements of the invention as described above as a reproducing head for magnetic recording, a structure shown in FIG. 6 can be adopted as a shield type structure.

A lower shield layer 32 composed of a ferromagnetic material is formed on a substrate 31, and an MR film 34 composed of a laminated film of a free layer/a non-magnetic conductor layer/a pin layer/a magnetically fixing magnetized layer is formed on a lower gap layer 33 composed of an insulator formed on the lower shield layer 32.

A bias magnetic field is given to the MR film 34 by a hard magnetic layer 35. Electrodes 36 are formed through the hard magnetic layer 35 or directly on the MR film 34, and an upper magnetic shield layer 38 composed of a ferromagnetic material is formed on an upper gap layer 37 composed of an insulator covering the electrodes 36. Alumina or the like can be used as an insulator, and an amorphous magnetic alloy such as Permalloy, CoZrNb, or the like can-, be used as a ferromagnetic material.

In this structure, a magnetic field of a recording medium enters between the upper and lower magnetic shield layers 38 and 32, and the MR film detects this magnetic field. It is possible also to flatten the area of the MR laminated film by embedding the electrodes 36, the hard magnetic film, and the like in the substrate. And it is possible also to arrange the antiferromagnetic film at the substrate side by turning the lamination structure upside down. In case of forming a reproducing/recording one body type head, it will do, for example, to use the upper magnetic shield also as a recording magnetic pole and form a thin film coil on this magnetic pole.

Figure 7A:
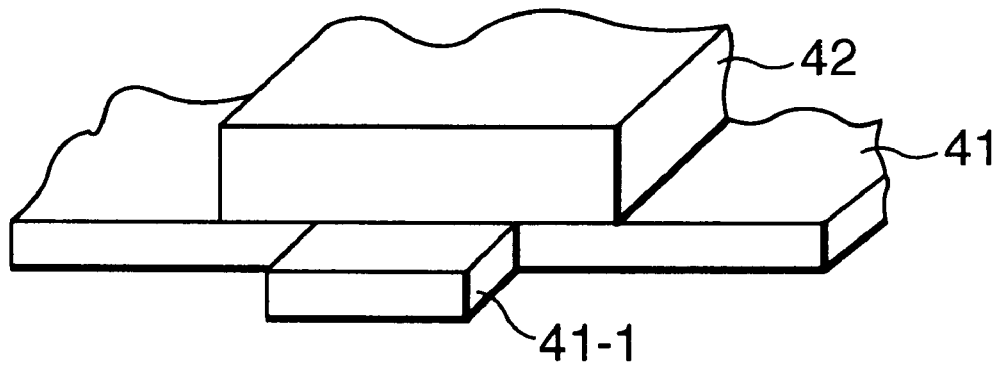
FIGS. 7A and 7B are schematic views of examples of a reproducing/recording one body type head using a magnetoresistance effect element of the invention.

And a structure in which a yoke takes in a magnetic field of a recording medium and an MR film detects the magnetic field can be also adopted (see FIG. 7A). As shown in FIG. 7A, an MR part 42 is formed on a yoke 41 provided with a projection 41-1 projecting toward a recording medium side. The MR part 42 detects a magnetic field of the recording medium introduced through yoke 41. A head is composed by arranging a part of this structure between the upper and lower magnetic shields (not illustrated). In the structure shown in FIG. 7A, the recording medium is moved in the upward or downward direction with respect to the figure.

Figure 7B:
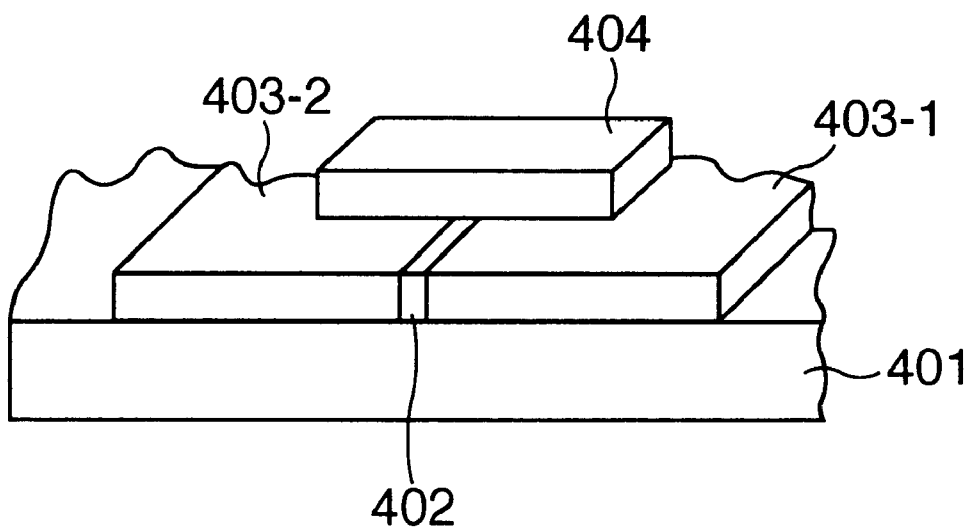

Furthermore, as shown in FIG. 7B, a structure in which a recording medium is moved in the left or right direction with respect to the figure can be adopted. FIG. 78 shows disposing a pair of yokes 403-1 and 403-2 opposite each other, with a magnetic gap 402 interposed between them on a substrate 401. An MR part 404 is then formed between the pair of yokes.

Any of the above structures is excellent in corrosion resistance and wear resistance, since the MR part retreats from the medium surface. In case of a reproducing/recording one body type head, a recording head of induction type can be also stacked. Without being limited to a head, such an MR element can be applied to a magnetic field sensor or can be used as a recording element (what is called MRAM) instead of being used as a sensor. For example it can be applied to a system in which "1" and "0" are recorded according to a direction of magnetization in a free layer in a spin valve structure and the information is read out by means of difference in electric resistance depending upon the directions of magnetization of the free layer and the pin layer.

Additionally, it is a matter of course that the invention can be applied to an element using a magnetoresistance effect caused by magnetic spin dependent scattering.

Described below are exemplary embodiments consistent with the present invention.

Embodiment 1

A magnetoresistance effect element of a spin valve type may be formed using a silicon substrate having a thermally oxidized film on its surface. The following films are then formed on the substrate in the order listed:

$Co_{90}Zr_6Nb_4$ amorphous magnetic film: 100A (angstrom);
$Ni_{80}Fe_{20}$ film: 20A;
$Co_{90}Fe_{10}$ film: 40A;
Cu film: 30A;
$Co_{90}Fe_{10}$ film: 40A; and
FeMn film: 150A.

The above is a composite laminated film composed of a first magnetic layer which is a pin layer of a single layer of a CoFe film and a second magnetic layer which is a free layer composed of two layers of a CoZrNb film and an NiFe film. A Ti film of 50A in thickness is then superposed on the FeMn film as a protective layer.

The laminated films were annealed under the following conditions.

(1) Heating a sample at 250° C. while applying a magnetic field of 1 kOe to the sample in one direction a for one hour, and then cooling it to the room temperature while applying the magnetic field to it. (2) Heating a sample at 250° C. while applying a magnetic field of 1 kOe to the sample in one direction a for one hour, and cooling it to 200° C. while applying the magnetic field to it, and turning the magnetic field by 90 degrees (direction b) when the temperature reached 200° C., and then cooling the sample to room temperature. (3) Heating a sample at 250° C. while applying a magnetic field of 1 kOe to the sample in one direction a for one hour, and cooling it to 150° C. while applying the magnetic field to it, and turning the magnetic field by 90 degrees (direction b) when the temperature reached 150° C., and then cooling the sample to room temperature.

For the above-mentioned three examples, Table 1 shows a result of measuring an anisotropic magnetic field of a free layer by means of a VSM.

For reference, $H_k$ in case that each magnetic film alone was formed is also shown. And the direction of axis of easy magnetization of each magnetic film is shown by the direction of a magnetic field applied to it.

TABLE 1

|  | | Free Layer | | | Pin Layer |
| --- | --- | --- | --- | --- | --- |
|  | $H_k$ (Oe) | CoZrNb | NiFe | CoFe | CoFe |
| (1) | 11 | 7(a) | 3(a) | 13(a) | 300(a) |
| (2) | 3 | 7(a) | 3(a) | 11(b) | 300(a) |
| (3) | 11 | 7(a) | 3(a) | 13(a) | 300(a) |

In any case, an uniaxial magnetic anisotropy in the direction a was given to a free layer on the whole.

In case of condition (1), since every film in a free layer has an anisotropy in the direction a, the anisotropic magnetic field of the whole free layer becomes a simple average of them (where film thickness and magnetization are considered), which is as great as 11 Oe.

In case of condition (3), anisotropy of the pin layer is in the direction b together with the FeMn layer, but anisotropy of the free layer is uniformly in the direction a in the same way as condition (1), and the anisotropic magnetic field is still as great as 11 Oe.

In case of condition (2), on the other hand, the direction of axis of easy magnetization of the CoFe film in the free layer, where the direction of an inductive magnetic anisotropy is easy to turn, is perpendicular to the directions of axis of easy magnetization of the CoZrNb film and the NiFe film. As a result, an anisotropic magnetic field of 3 Oe which is so low that the CoFe film may not attain it by itself has been attained. As a result of actually measuring a magnetic field as a magnetoresistance effect element having a film configuration according to the condition (2), a resistance change ratio exceeding 10% could be obtained and a thermal resistance exceeding 200° C. was confirmed. A value of $H_k$ (total) obtained by said computation was nearly equal to the measured value $H_k$., and only in case of condition (2), the value of $H_k$ (total) satisfied the condition of 10 or less.

Comparing magnetoresistance effects, while the sensitivity in case of condition (2) was 1.6%/Oe, that in condition (1) was 0.45%/Oe and that in condition (3) was 0.45%/Oe, and it was confirmed that the sensitivity in condition (2) was the highest among them.

Thus, according to the invention, it is possible to attain a soft magnetic property in a Co alloy. Further, it is possible to obtain a magnetoresistance effect element which can obtain a great resistance change with a small magnetic field as making the best use of a high thermal resistance and a high resistance change ratio of the Co alloy.

Furthermore, a similar effect can be obtained also by using an-alloy other than a Co alloy. As a substrate, in addition to a silicon substrate, for example, an alumina substrate, an AlTiC substrate having an alumina film attached to it according to demand, and the like can be used.

As described above, also in case of using such a high coercive force material as a Co alloy, a good soft magnetic property can be attained and even by using a high coercive force material, it is possible to obtain a magnetoresistance effect element which can obtain a great resistance change with a small magnetic field.

Embodiment 2

First, an amorphous CoNbZr alloy film and an NiFe alloy film are formed one after another as a soft magnetic layer on a thermally oxidized silicon substrate by means of a sputtering method. For sake of comparison, the amorphous CoNbZr alloy film was changed in film thickness and four kinds of samples of amorphous CoNbZr alloy films of 3 nm, 5 nm, 7 nm, and 10 nm in thickness were made. The NiFe alloy film was constantly set at 2 nm in thickness.

Next, on the soft magnetic layer composed of the soft magnetic material laminated film, the following films are formed: a $Co_{90}Fe_{10}$ alloy film of 3 nm in thickness as a ferromagnetic film, a Cu film of 3 nm in thickness as a middle non-magnetic layer, a $Co_{90}Fe_{10}$ alloy film of 3 nm in thickness as a second magnetic layer, an IrMn alloy film of 10 nm in thickness as an antiferromagnetic layer, and a Ta film of 5 nm in thickness as a protective layer. As a result, a spin valve laminated film was formed.

In the spin valve laminated film as described above, by the soft magnetic layer composed of a laminated film made by laminating an amorphous CoNbZr alloy film and an NiFe alloy film, dispersion of anisotropy of the $Co_{90}Fe_{10}$ alloy film as the ferromagnetic layer, adjacent to the soft magnetic layer is suppressed. Further, an uniaxial magnetic anisotropy is given to the $Co_{90}Fe_{10}$ alloy film as the second magnetic layer adjacent to the IrMn antiferromagnetic film.

After this, an MR element was obtained by patterning said spin valve laminated film, and applying to it said orthogonalizing annealing process. This allows the direction of an uniaxial anisotropy of the $Co_{90}Fe_{10}$ alloy film as the pin magnetic layer and the direction of an uniaxial anisotropy of the $Co_{90}Fe_{10}$ alloy film in the free magnetic layer to be perpendicular to each other, improving the spin valve laminated film in its linear response characteristics to an external magnetic field.

A coercive force $H_c$ in the direction of hard axis of magnetization, on the whole, of each of the MR elements obtained by changing the amorphous CoNbZr alloy film in thickness was measured. Table 2 shows relation between a $\Sigma(M_s \times d \times H_k)$ value of a laminated film of an amorphous CoNbZr alloy film and an NiFe alloy film in each MR element and a coercive force $H_c$ in the direction of hard axis of magnetization of each MR element on the whole.

TABLE 2

| Sample number | Thickness of CoNbZr alloy film (nm) | $\Sigma (M_s \times d \times H_k)$ value (Tnm Oe) | Coercive force $H_c$ in the direction of hard axis of magnetization (Oe) |
| --- | --- | --- | --- |
| 1 | 3 | 11.2 | 2.6 |
| 2 | 5 | 33.6 | 0.9 |
| 3 | 7 | 64.5 | 0.6 |
| 4 | 10 | 102 | 0.2 |

As apparently known from Table 2, as thickness of the amorphous CoNbZr alloy film $\Sigma(M_s \times d \times H_k)$ value becomes large and the coercive force $H_c$ decreases. Sample No.1 has 30(Tnm Oe) or less as its $\Sigma(M_s \times d \times H_k)$ value and a coercive force of greater than 1 Oe. Each of the samples No. 2 to 4 have greater than 30(Tnm Oe) as their $\Sigma(M_s \times d \times H_k)$ value and a coercive force $4_c$ not greater than 1 Oe. In this way, a good soft magnetic property can be obtained by satisfying $\Sigma(M_s \times d \times H_k) > 30$(Tnm Oe). Furthermore, examining MR change ratios of said samples, any of them showed a value as large as 7% or more.

And MR heads of the same structure were made by using MR elements of said samples. The heads were made on an AlTiC substrate of 3 inches in diameter and 800 heads were obtained from one substrate. A manufactured head was built in an actual disk drive and the number of heads in Barkhausen noises happened was confirmed for every heads of each sample number, result is shown in Table 3.

TABLE 3

| Sample Number | Thickness of CoNbZr film (nm) | Number of heads where Barkhausen noises happened |
| --- | --- | --- |
| 1 | 3 | 380 |
| 2 | 5 | 65 |
| 3 | 7 | 10 |
| 4 | 10 | 6 |

From Table 3, it is known that the greater the $\Sigma(M_s \times d \times H_k)$ value is, the less Barkhausen noises happen.

Embodiment 3

Aspin valve laminated film of the same structure as embodiment 1, except using an $(Ni_{70}Fe_{10}Co_{20})_{95}Cr_5$ alloy film as a soft magnetic layer instead of using a soft magnetic layer composed of a laminated film made by laminating an amorphous CoNbZr alloy film and an NiFe alloy film in the embodiment 2, was manufactured. The thickness of the $(Ni_{70}Fe_{10}Co_{20})_{95}Cr_5$ alloy film as the soft magnetic layer was changed as shown in Table 3.

Next, by patterning said spin valve stacked film and then applying the same orthogonalizing annealing process as the embodiment 1 to it, an MR element was obtained. A coercive force $H_c$ in the direction of hard axis of magnetization, on the whole, of each of these MR elements measured. The result is shown in Table 4.

TABLE 4

| Sample number | Thickness of $(Ni_{70}Fe_{10}Co_{20})_{95}Cr_5$ alloy film (nm) | $\Sigma (M_s \times d \times H_k)$ value Tnm Oe) | Coercive force $H_c$ in the direction of hard axis of magnetization (Oe) |
| --- | --- | --- | --- |
| 5 | 3 | 24 | 1.5 |
| 6 | 5 | 40 | 0.8 |
| 7 | 7 | 56 | 0.7 |
| 8 | 10 | 80 | 0.5 |

As shown in Table 4, when using an $(Ni_{70}Fe_{10}Co_{20})_{95}Cr_5$ alloy film as a soft magnetic layer, as thickness of the film increases, the $\Sigma(M_s \times d \times H_k)$ value becomes large and the coercive force $H_c$ decreases. Samples No. 6 to 8, whose $\Sigma(M_s \times d \times H_k)$ values exceed 30(Tnm Oe), are 1 Oe or less in coercive force $H_c$. In this way, a good soft magnetic property can be obtained by satisfying $\Sigma(M_s \times d \times H_k) > 30$(Tnm Oe).

Examining MR change ratios of said samples, any of them satisfying $\Sigma(M_s \times d \times H_k) > 30$(Tnm Oe) showed a value as large as 7% or more. MR heads were made in the same way as embodiment 2. As a result of examining whether or not Barkhausen noises occurred, it was confirmed that occurrence of Barkhausen noises can be suppressed in case of using an MR element whose coercive force $H_c$ is 1 Oe or less.

As described above, according to a magnetoresistance effect element of the invention, it is possible to obtain a great MR change quantity and a good soft magnetic property in good repeatability. Accordingly, a magnetoresistance effect element of a spin valve film can be greatly improved.

It will be apparent to those skilled in the art that various modifications and variations can be made to the system and method of the present invention without departing from the spirit or scope of the invention. The present invention covers the modifications and variations of this invention provided they come within the scope of the appended claims and their equivalents.

What is claimed is:

1. A magnetoresistance effect element having a spin valve film comprising:
   a first magnetic layer including a ferromagnetic film containing Co and a magnetic film;
   a second magnetic layer; and
   a non-magnetic layer disposed between said first and second magnetic layers,
   wherein said magnetic film is one selected from a soft magnetic material film formed of one kind of soft magnetic material and a laminated soft magnetic material film formed of at least two kinds of soft magnetic materials, said magnetic film satisfying the following condition:

$$\Sigma(M_s \times d \times H_k) > 30 (T \times nm \times Oe),$$

where $M_s$ represents the magnetization of said magnetic film, d represents the thickness of said magnetic film, and $H_k$ represents the anisotropic magnetic field of said magnetic film.

2. A magnetoresistance effect element as set forth in claim 1, wherein said magnetic film is a soft magnetic film whose anisotropic magnetic field $H_k$ is at least 5 Oe.

3. A magnetoresistance effect element as set forth in claim 1, wherein said ferromagnetic film containing Co contacts said non-magnetic layer.

4. A magnetoresistance effect element as set forth in claim 1, wherein said ferromagnetic film containing Co and said magnetic film have a magnetic exchange coupling between them and act as one body with respect to an external magnetic field.

5. A magnetoresistance effect element as set forth in claim 1, wherein a direction of magnetization of said first magnetic layer and a direction of magnetization of said second magnetic layer are substantially perpendicular to each other.

6. A magnetoresistance effect element as set forth in claim 1, wherein said ferromagnetic film containing Co satisfies the following condition:

$$1 nm \leq d \leq 10 nm,$$

where d represents the thickness of said ferromagnetic film containing Co.

7. A magnetic reproducing/recording head, comprising a magnetoresistance effect element having a spin valve film comprising:
   a first magnetic layer including a ferromagnetic film containing Co and a magnetic film;
   a second magnetic layer; and
   a non-magnetic layer disposed between said first and second magnetic layers,
   wherein said magnetic film is one selected from a soft magnetic material film formed of one kind of soft magnetic material and a laminated soft magnetic material film formed of at least two kinds of soft magnetic materials, said magnetic film satisfying the following condition:

$$\Sigma(M_s \times d \times H_k) > 30 (T \times n \times Oe),$$

where Ms represents the magnetization of said magnetic film, d represents the thickness of said magnetic film, and Hk represents the anisotropic magnetic field of said magnetic film.

* * * * *

UNITED STATES PATENT AND TRADEMARK OFFICE
CERTIFICATE OF CORRECTION

PATENT NO. : 6,088,195
DATED : July 11, 2000
INVENTOR(S) : Kamiguchi et al.

It is certified that error appears in the above-identified patent and that said Letters Patent is hereby corrected as shown below:

Claim 7, column 20,
Line 27, change "30(T x n x Oe)" to -- 30(T x nm x Oe) --.
Line 30, change "Hk" to -- $H_k$ --.

Signed and Sealed this

Ninth Day of October, 2001

Attest:

NICHOLAS P. GODICI
Attesting Officer
Acting Director of the United States Patent and Trademark Office